United States Patent [19]

Shimizu

[11] Patent Number: 5,733,686
[45] Date of Patent: Mar. 31, 1998

[54] PHASE-SHIFTING MASK

[75] Inventor: Hideo Shimizu, Kanagawa, Japan

[73] Assignee: Sony Corporation, Tokyo, Japan

[21] Appl. No.: 890,003

[22] Filed: May 29, 1992

[30] Foreign Application Priority Data

May 30, 1991 [JP] Japan ................... 3-155768

[51] Int. Cl.$^6$ ................................................ G03F 9/00
[52] U.S. Cl. ................................................ 430/5
[58] Field of Search ................................................ 430/5

[56] References Cited

U.S. PATENT DOCUMENTS 5,045,417  9/1991  Okamoto ................... 430/5

FOREIGN PATENT DOCUMENTS 0090924  12/1983  European Pat. Off. ........... 430/5

Primary Examiner—Mark Chapman
Attorney, Agent, or Firm—Hill, Steadman & Simpson

[57] ABSTRACT

A phase-shifting mask having a phase-shifting portion for shifting the phase of a transmission light on both of one surface and another surface of a transparent substrate. In a preferred embodiment, at least a portion of the phase-shifting portion on one surface overlaps with at least one portion of the phase-shifting portion on the other surface. The phase-shifting mask is applicable both to negative and positive type masks and can be formed easily with no problems, such as reduction of the transmittance and close contact.

7 Claims, 8 Drawing Sheets

PHASE-SHIFTING MASK

BACKGROUND OF THE INVENTION

1. Field of the Invention

The present invention concerns a phase-shifting mask. The present invention can be used as a phase-shifting mask employed, for example, for the technique of forming various kinds of patterns it can be utilized, for example, as a phase-shifting photomask employed as a mask in a case of forming a resist pattern in a semiconductor device manufacturing process.

2. Description of the Prior Art

In semiconductor devices and other products formed by utilizing photomasks, the fabrication size has become finer year by year. In photolithography for obtaining refined semiconductor devices given such a background, a so-called phase-shifting technique of providing a phase difference to a light that transmits through a mask thereby improving the profile of light intensity has been highlighted in order to further improve the resolution power thereof.

Prior art phase-shifting technology has been disclosed, for example, in Japanese Patent Laid-Open Sho 58-173744, by Marc D. Levenson, et. al. in "Improving Resolution in Photolithography with a Phase-Shifting Mask" IEEE, Transaction On Electron Devices, Vol. ED-29, No. 12, December 1982, p 1828–1836 or by Marc D. Rivenson, et. al. in "The Phase-Shifting Mask I: Imaging Simulations and Submicrometer Resist Exposures", IEEE Transactions On Electron Devices Vol. ED-31, No. 6, June 1984, P753–763.

Further, Japanese Patent Publication Sho 62-50811 discloses a phase-shifting mask having a predetermined pattern comprising a light permeable portion and a light impermeable portion, in which a phase member is disposed at least one of the permeable portions on both sides of the impermeable portion, to cause a phase difference between the permeable portions on both sides.

Descriptions will now be made of existing phase-shifting techniques known thus far with reference to FIG. 5. For instance, in the case of forming a line-and-space pattern, in a conventional mask as shown in FIG. 5(a), a light shielding portion 10 is formed by using a light shielding material such as chromium or other metals or metal oxides on a transparent substrate 1 such as a quartz substrate, thereby forming a line-and-space repeating pattern to form an exposure mask. From a theoretical point of view, the intensity distribution of light transmitting through the exposure mask is 0 in the light shielding portion as shown by the reference A1 in FIG. 5(a), while the light transmits through other portions (permeable portions 12a, 12b). Now considering one permeable portion 12a, the transmission light transmitted onto an exposed material forms a light intensity distribution having maximum peaks as shown at A2 in FIG. 5(a). The transmission light A2' from the permeable portion 12b is shown by a dotted line. When lights from both of the permeable portions 12a and 12b are joined, sharpness of the light intensity distribution is lost as shown by A3, images are blurred due to the light diffraction and a sharp exposure can not be attained. On the contrary, when a phase-shifting portion 11a (referred to as a shifter, made of material such as $SiO_2$ or resist) is disposed on every other light permeable portion 12a and 12a of the repeating pattern described above as shown in FIG. 5(b), blurring of the images due to light diffraction is offset by the inversion of the phase, accordingly sharp images are transferred to improve the resolution power or the focal point margin. That is, as shown in FIG. 5(b), when a phase-shifting portion 11a is formed at the light permeable portion 12a on one side, and if this gives a phase shifting, for example, of 180°, the light passing through the phase-shifting portion 11a is inverted as shown by the reference B1. On the other hand, the light from the light permeable portion 12b adjacent thereto does not pass through the phase-shifting portion 11a and, accordingly, undergoes no such inversion. Referring to the light given to the exposed member, lights inverted from each other are offset to each other relative to the light intensity distribution at a position shown by B2 in the figure, and, the light distribution given to the exposed material has an identical sharp shape as shown at B3 in FIG. 5(b).

In the above-mentioned case, it is most advantageous to invert the phase by 180° for making the effect most reliable, and a phase-shifting portion 11a formed with a membrane with a thickness D represented by the following equation is provided:

$$D = \frac{\lambda}{2(n-1)}$$

wherein n is a refractive index of the phase-shifting portion and $\lambda$ is an exposure wavelength.

In a case of forming a pattern by exposure, a member used for diminishing projection is referred to as a reticle, a member for 1:1 projection is referred to as a mask, and a reticle or a copy prepared therefrom is referred to as a mask. In the present invention, masks and reticles in such various meanings are collectively referred to as a mask.

The phase shifting technology in the prior art as described above involves the following problems. That is, in the phase-shifting mask of this type as shown in FIG. 6, since the light intensity is remarkably reduced at the boundary between the phase-shifting amount of 0° and that of 180° (portion E in the drawing), it can not be applied to a positive type mask in which light permeable portions are contiguous. For solving this problem, it has been proposed to provide a 90° phase-shifting portion 11A for shifting the phase of light by 90° (90° shifter) and situate the shifter at the boundary between the portion for the phase-shifting amount of 0° and that of 180° (180° phase shifting portion 11A), thereby applying the phase-shifting technology also to the positive type mask (pretext of 51th Autumn meeting of the Society of Applied Physics (1990), 429p, 27p-ZG-6). However, the mask of such a structure is difficult to form and put to practical use. For instance, it may be considered to form a 90° shifter by controlling the exposure amount upon applying EB exposure or, further, applying etching partially after EB exposure and development. However it is extremely difficult in each of these cases to actually put these techniques into practical use. In the above-mentioned proposal, a negative type resist is used for the phase-shifting material and the amount of EB dose to the negative type resist is changed to vary the residual amount of films upon development to obtain a 90° shifter. However, the control is difficult. Further, when the phase-shifting portion is formed by using the resist as the shifter material, it may sometimes make practical use difficult, such as difficulty in cleaning. In such a case, it may be desirable to form a so-called hard shifter using an inorganic material such as SOG or CVD $SiO_2$. However, it is also difficult to provide such a hard shifter in two stages. For instance, in order to make the two stage construction by etching, a selection ratio has to be ensured in which a sandwich structure putting a stopper therebetween is necessary, or the first stage and the second stage have to be made of different materials. However, such means involve various problems such as reduction of the transmittance and poor adhesion between different materials and, after all, it is extremely difficult practically to form the shifters in two stages.

SUMMARY OF THE INVENTION

An object of the present invention is to overcome the foregoing problems and to provide a phase-shifting mask which can be embodied both in a negative type mask and a positive type mask, and which can be manufactured with ease while causing no problems, such as reduction of the transmittance or close contact.

The foregoing object of the present invention can be attained in accordance with the present invention by providing a phase-shifting mask having phase shifting portions disposed on both of one and the other surfaces of a transparent substrate for shifting the phase of a transmission light.

According to the feature of the present invention, since the phase-shifting portions are formed on both surfaces of the mask substrate, a necessary pattern for the phase-shifting portion can be obtained easily.

In a modified embodiment of the present invention, at least a portion of the phase-shifting portion on one surface overlaps with at least a portion of the phase-shifting portion on the other surface.

In this modified embodiment, an optional phase shifter can be formed by using an overlapped or not overlapped portion of the phase-shifting portions formed on both surfaces of the mask substrate and, for example, a 90° shifter can be formed easily between the phase-shifting amount 0° and phase-shifting amount 180° by using the not-overlapped portion as a 90° shifter, while using the overlapped portion as a 180° shifter. Accordingly, it can be formed easily also as a mask for the positive type resist and has a wide applicability.

In the present invention, the phase-shifting portion means a portion which allows a light to transmit while shifting the phase relative to the transmission light. The light shielding portion means a portion which inhibits the transmission of light for the exposure light used. The light permeable portion that allows a light to transmit at a phase-shifting amount of 0° allows the exposure light used to transmit therethrough. Although it is desirable that the light shielding portion and the light permeable portion have a great light shielding property and light transmitting property, respectively, it is not always necessary that they shut or transmit the light completely or nearly completely, but may shut or transmit the light to such an extent as is capable of forming a required pattern. It is also desirable that the phase-shifting portion has a large light transmittance like that of the light permeable portion, but it may suffice that it can conduct necessary phase-shifting and exposure.

As the material for the light shielding portion, chromium, as well as chromium oxide, any of the high melting metals (W, Mo, Be, etc.), and oxides thereof can be used.

The light permeable portion may be formed by using a transparent substrate portion not formed with the light shielding portion, or the phase-shifting portion as it is, so that the light is allowed to transmit therethrough.

As the transparent substrate, there can be mentioned quartz, usual glass, glass properly containing various kinds of ingredients or other appropriate materials.

In the present invention, the phase-shifting portion can generally be obtained by patterning a material forming the phase-shifting portions on both surfaces of a substrate. As the material for the phase-shifting portion, the following materials can be used generally.

That is, various kinds of organic materials usable as a photoresist can be used and, for example, EB resist (negative or positive resist) may be used to function also as a resist in the EB drawing device.

Alternatively, SiO, $SiO_2$ and silicon nitrides may also be used.

For it may suffice for the phase-shifting portion to attain desired phase-shifting, the phase-shifting portion may be formed by doping a substance that changes the refractive index along with a pattern to either one of the surfaces or a portion of the surface on one side of the substrate, thereby forming the phase-shifting portion on each of the surfaces.

DESCRIPTION OF THE ACCOMPANYING DRAWINGS

DESCRIPTION OF THE PREFERRED EMBODIMENTS

Description will now be made to preferred embodiments of the present invention, but the present invention is not restricted only to the embodiments described below.

EXAMPLE 1

Figure 1A:
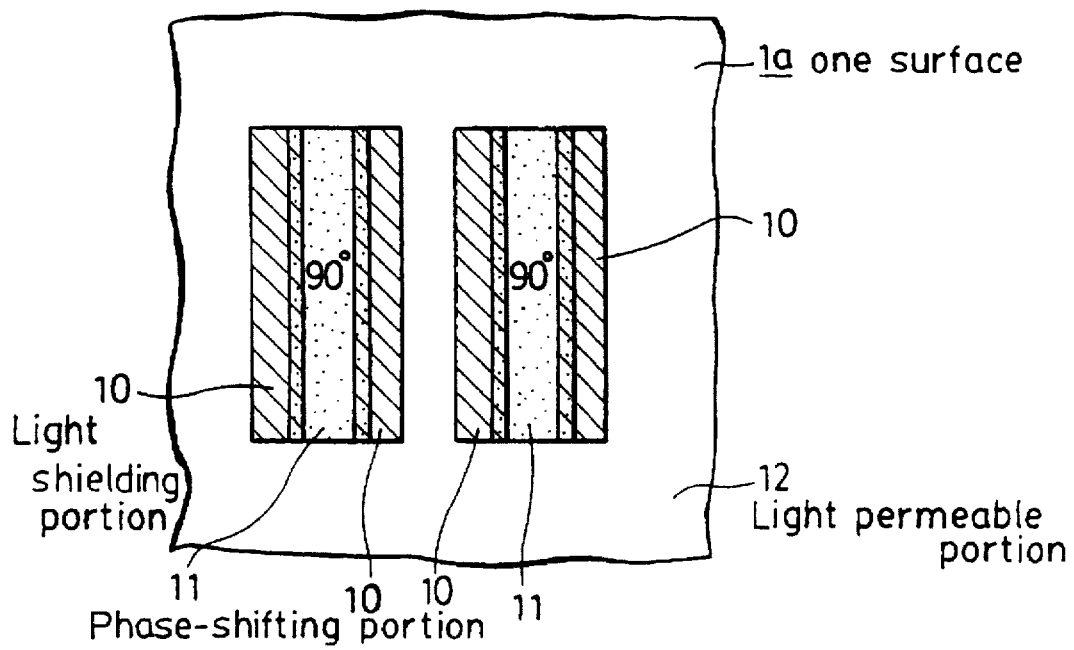
FIG. 1 is a plan view for one face (surface) and the other face (rearface) of a phase-shifting mask in Example 1.
Figure 1B:
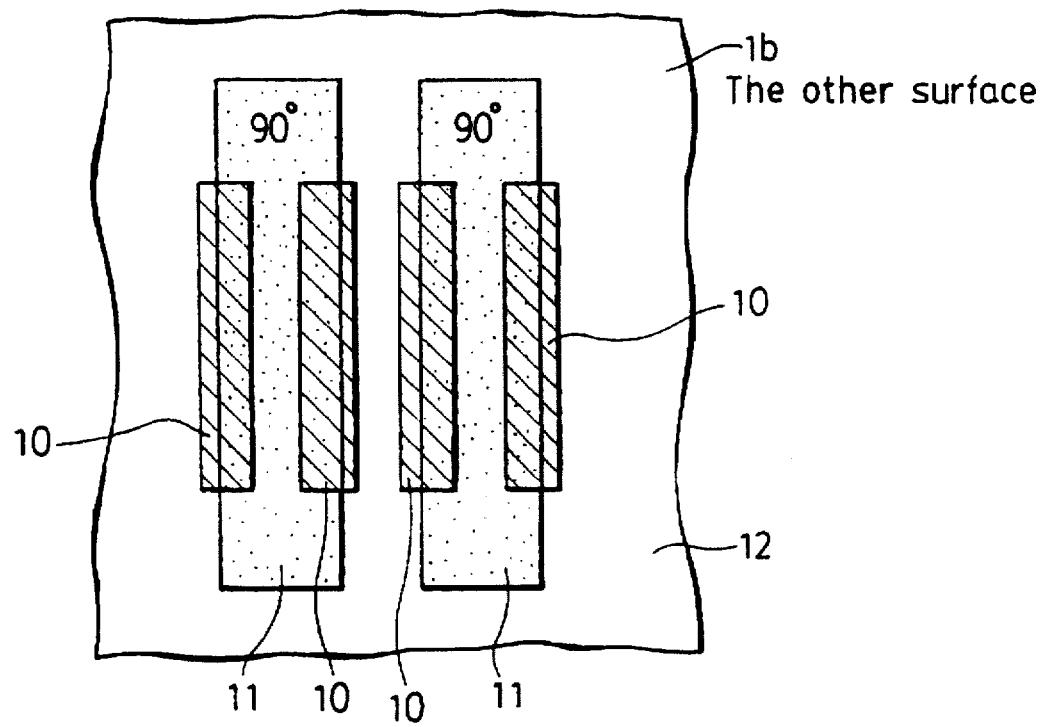

The phase-shifting mask in this example has a construction in which a phase-shifting portion 11 for shifting the phase of the transmission light is disposed to one surface 1a (referred to as a surface) of a transparent substrate, as shown in FIG. 1(a), and a phase-shifting portion 11 for shifting the phase of transmission light is disposed also at the other surface 1b (referred to as rearface) as shown in FIG. 1(b).

Figure 2:
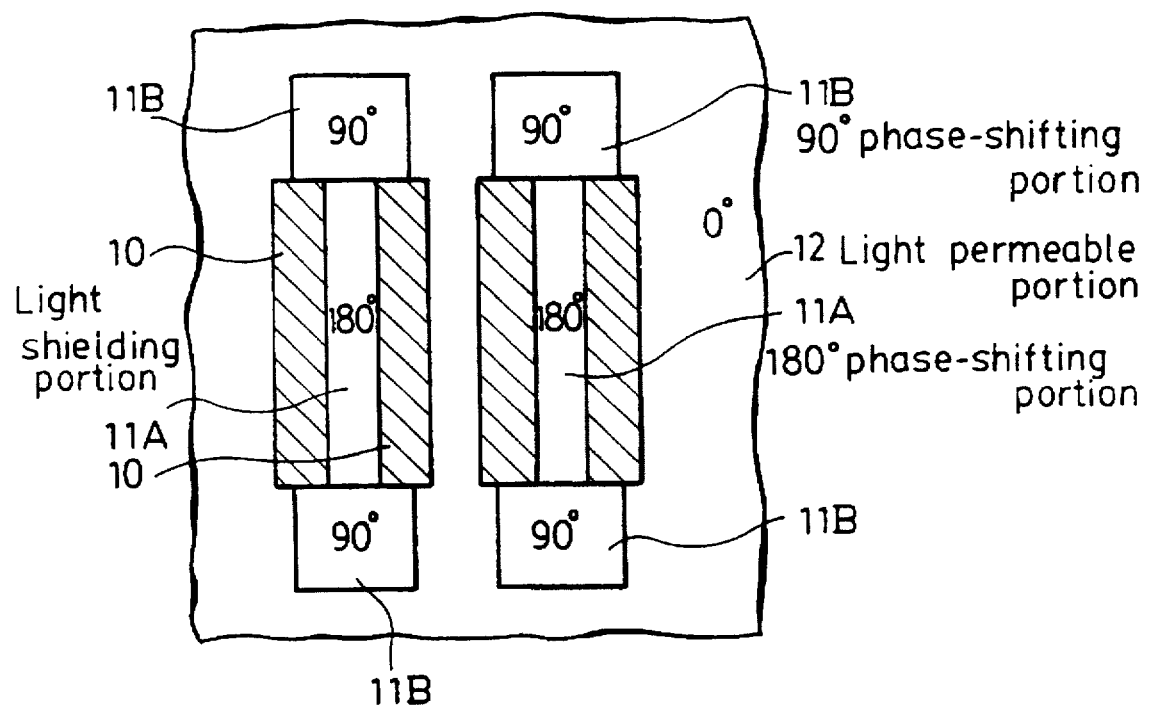
FIG. 2 is a view illustrating the construction of the phase-shifting mask and, in particular, the phase-shifting behavior thereof in Example 1.

In particular, in the phase-shifting mask of this example, at least a portion of the phase-shifting portion 11 on one surface 1a overlaps with at least a portion of the phase-shifting portion 11 on the other surface 1b. Specifically, since the phase-shifting amount in the phase-shifting portions 11 and 11 on both of the surfaces is 90° in this example, a portion where the phase-shifting portions 11 and 11 on both surfaces overlap each other forms a 180° phase-shifting portion 11A, while a portion at which the phase-shifting portions 11 and 11 are net overlapped with each other on both surfaces forms a 90° phase-shifting portion 11b as shown in FIG. 2. As shown in FIG. 2, the phase-shifting mask in this example is a mask for a positive type resist, and the boundary between the portion for the phase-shifting amount of 0° and that of 180° is a phase-shifting portion for 90° phase-shifting.

The phase-shifting mask in this example can be manufactured with ease as shown below. FIG. 3 shows an example for manufacturing steps.

A light shielding portion 10 is formed from a light shielding material such as chromium on a transparent substrate 1 made, for example, of quartz. This can be done in the same manner as the usual mask production, but a silicon nitride film ($Si_xY_y$ film) or a transparent conductive film (for example, ITO film) is previously formed as a stopper layer 7 for SOG etching in the subsequent step, in this example below chromium or the like as the light shielding material. In this state, SOG as the phase-shifting material layer 2 in this example is spin-coated and then a resist 3 is coated to form a structure shown in FIG. 3(a). Subsequently, a pattern for forming the phase-shifting portion is drawn and developed, and a resist pattern 31 is formed into a structure shown in FIG. 1(b).

Then, a phase-shifting pattern 21 is formed by etching. The pattern 21 forms the phase-shifting portion 11 on one surface, in which the thickness of the SOG layer as the phase-shifting material is made to one-half of a usual phase-shifting layer, so that 90° phase-shifting is attained. Such a structure is shown in FIG. 1(c).

Figure 3A:
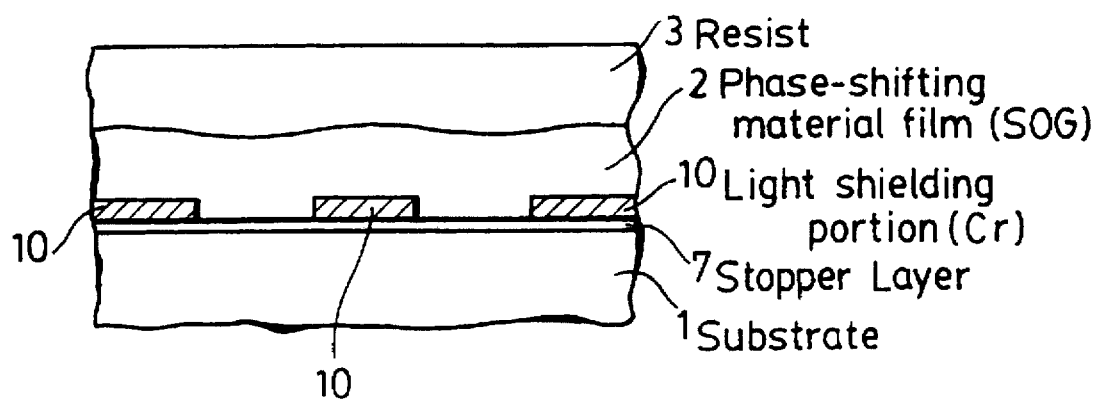
FIG. 3 is a view illustrating an example of manufacturing steps of the phase-shifting mask.
Figure 3B:
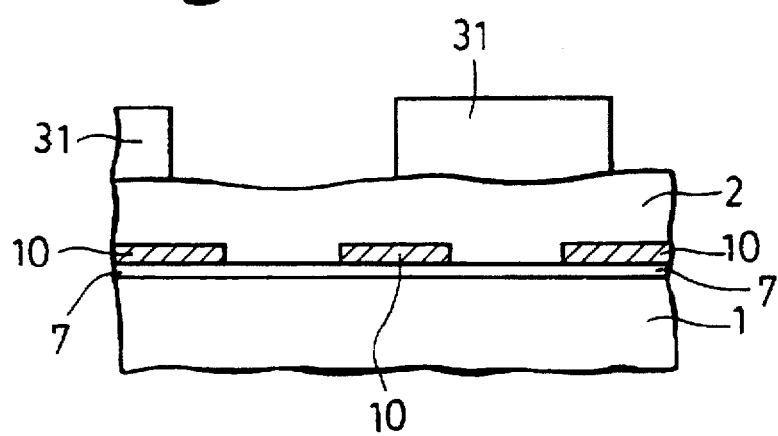
Figure 3C:
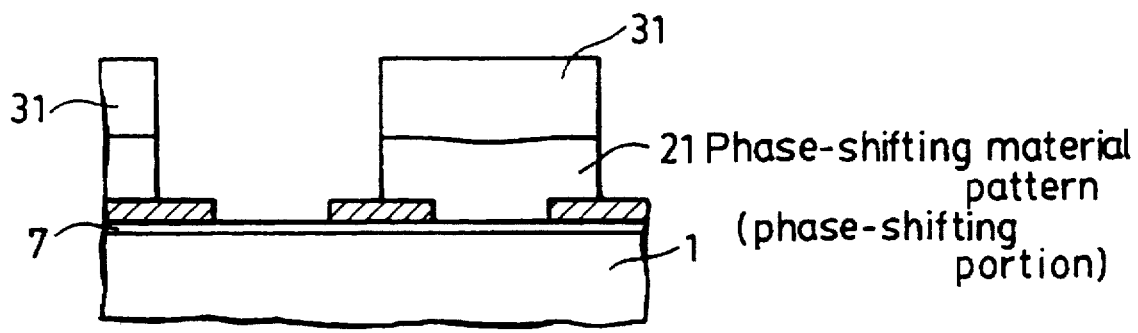
Figure 3D:
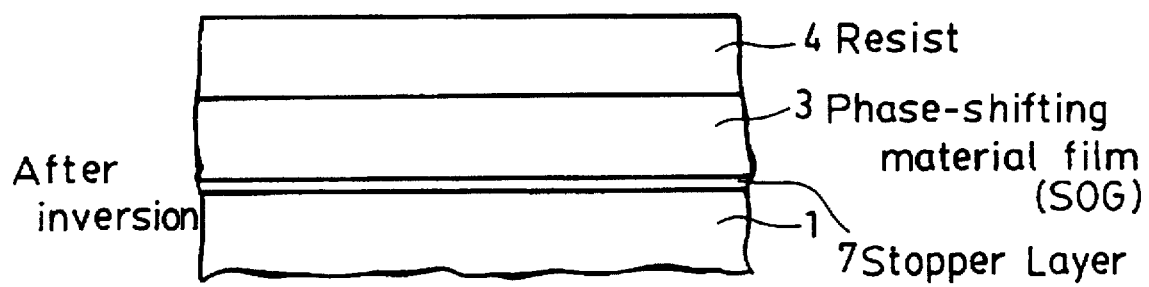

Then, the mask is turned upside down, SOG as the phase-shifting material is again coated on the other surface (rearface) to form a phase-shifting material layer 3, and the resist 4 is further coated. Thus a structure shown in FIG. 3(d) is formed. A resist 4 is drawn to form a resist pattern 41 like that for the surface. Further, etching is applied to form a phase-shifting material pattern 31 to obtain a structure shown in FIG. 3(e). In this case, alignment of the patterns between the surface and the rear face is practically important. For instance, if the alignment can not be attained from the rearface by an EB drawing device, a laser drawing device may be used. In this case, drawing for the surface deposited with chromium as the light shielding material may be drawn by EB, but it is necessary to draw the rearface by the laser.

Figure 3E:
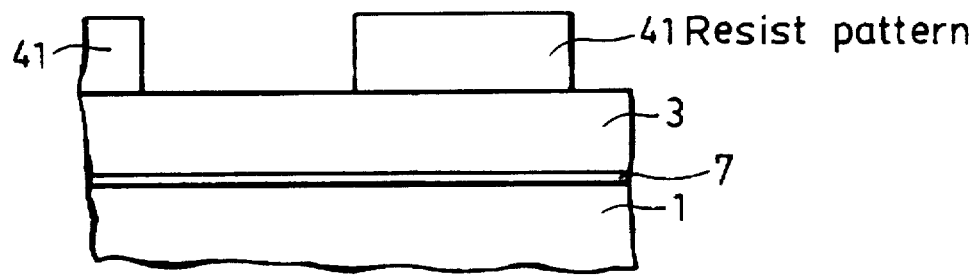
Figure 3F:
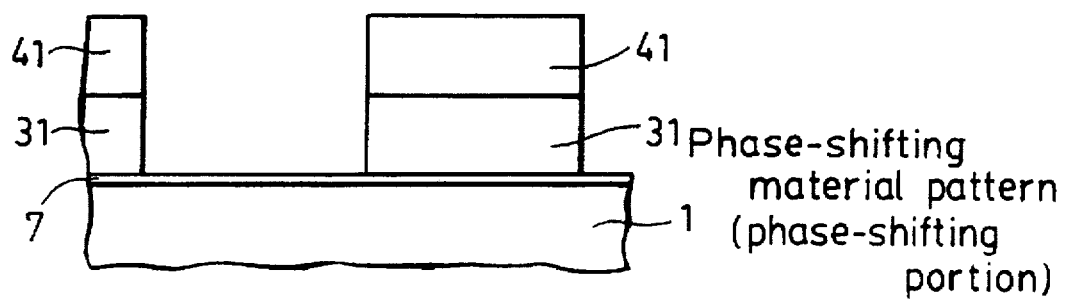

The phase-shifting material layer 3 is patterned by using the resist pattern 41 shown in FIG. 3(e) as a mask to obtain a phase-shifting material pattern 31. Thus, the structure shown in FIG. 3(f) is formed. The phase-shifting material pattern 31 obtained in FIG. 3(f) forms the phase-shifting portion 11 on the rearface. In this example, the phase-shifting amount is set to 90° like that of the phase-shifting portion 11 on the surface.

Figure 3G:
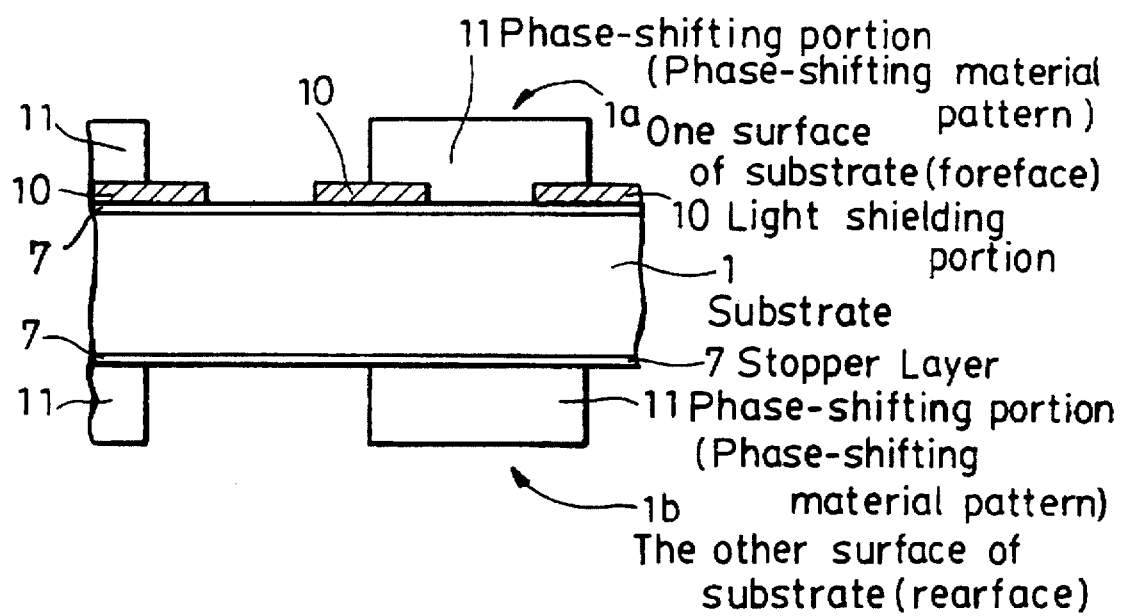

As a result, a phase-shifting mask of this example is obtained, the cross section of which is shown in FIG. 3(g) and the behavior of the phase-shifting amount of which is shown in FIG. 2. As can be seen from each of the figures, a 180° shifter (180° phase-shifting portion) 11A partially containing a 90° shifter (90° phase-shifting portion 11B) is formed. Since it is not necessary to determine the size so strictly, in the 90° shifter of a line-and-line space pattern, a slight deviation from the alignment is tolerable.

As has been described above, the phase-shifting mask of this example requires no particularly difficult process, and the 90° phase-shifting portion can be obtained easily with an inorganic material, which is applicable also as a positive mask.

In this example (and also in the subsequent example), an i-line resist is usable, for instance, for laser drawing. For example, a positive resist such as PFI-15 (manufactured by Sumitomo Kagaku) or NPRA-185HR (manufactured by Nagase Sangyo) can be used. In this example, SOG forming the phase-shifting layer is a particularly thin layer and, in a case where it is formed as an exposure mask for a KrF excimer laser, it is about 0.15 μm. Therefore, those capable of forming a thin film, for example, X-11 series, in particular 111, manufactured by of Allied Signal Co is used for instance.

EXAMPLE 2

This is an example for preparing a phase-shifting mask of a similar structure by another manufacturing method. The steps are shown in FIG. 4.

Figure 4A:
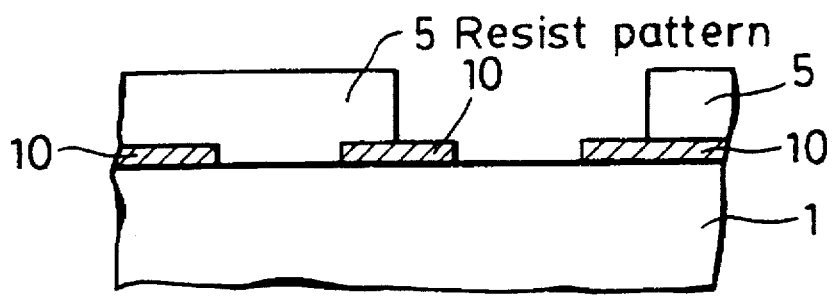
FIG. 4 is a view illustrating another example of manufacturing steps of the phase-shifting mask.
Figure 4B:
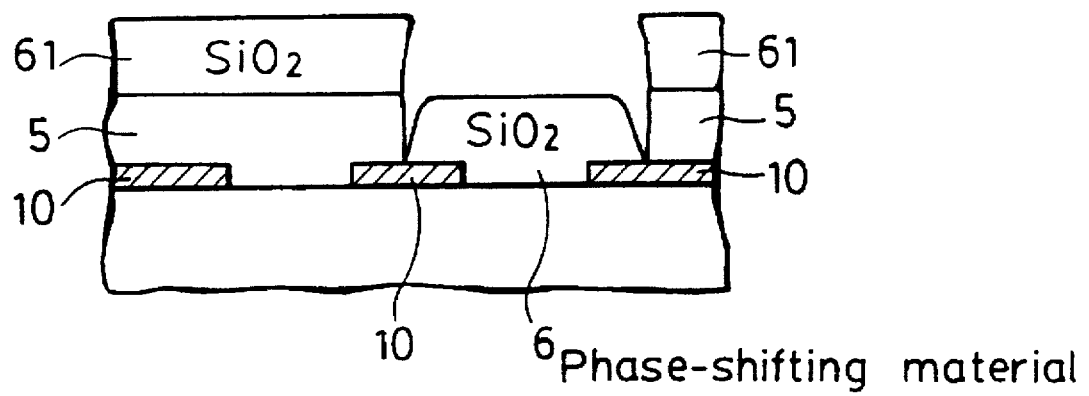
Figure 4C:
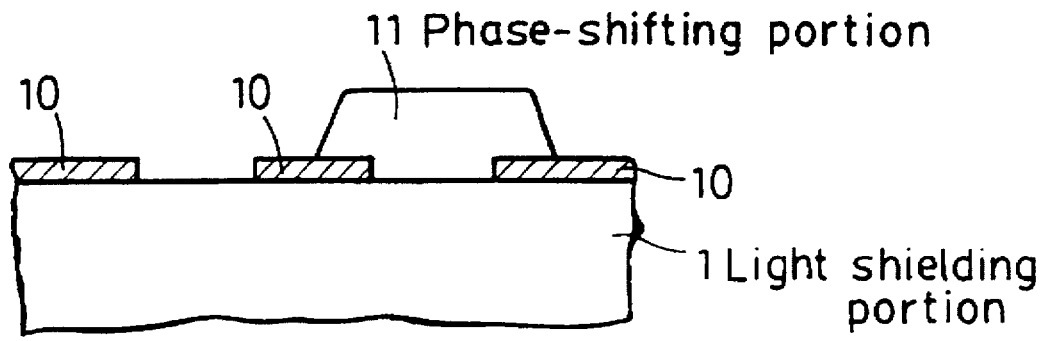
Figure 5A:
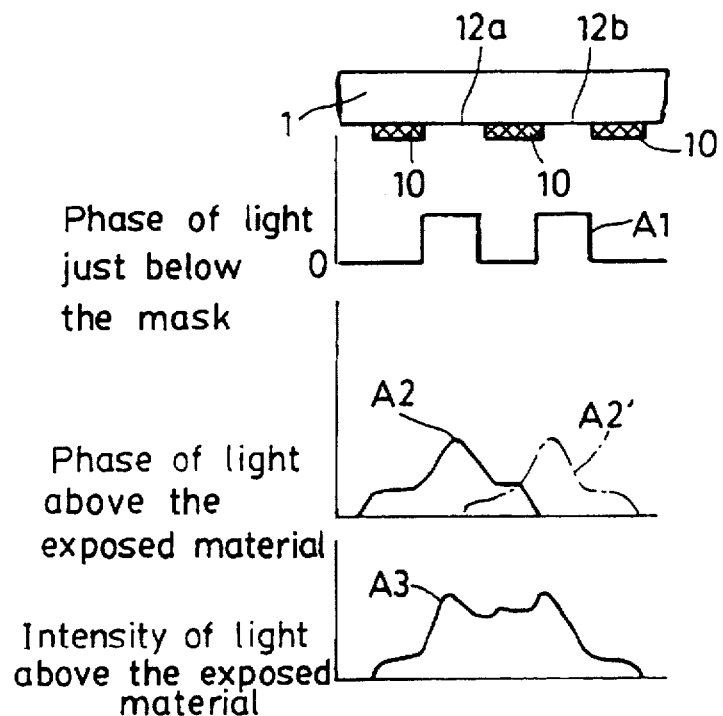
FIG. 5 is an explanatory view for the principle of the phase-shifting mask.
Figure 5B:
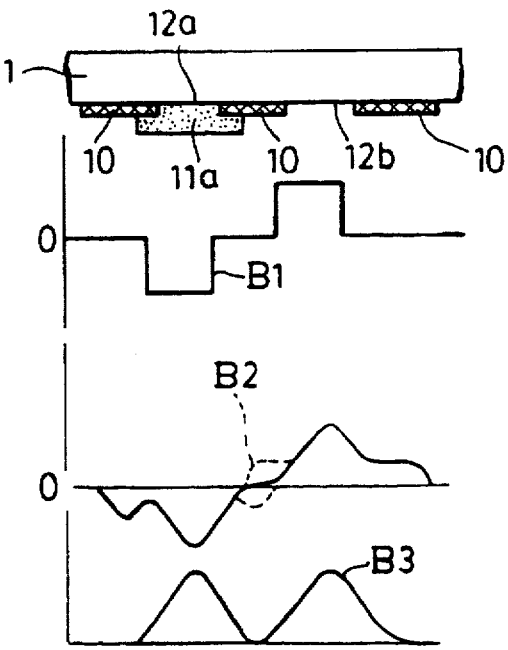
Figure 6:
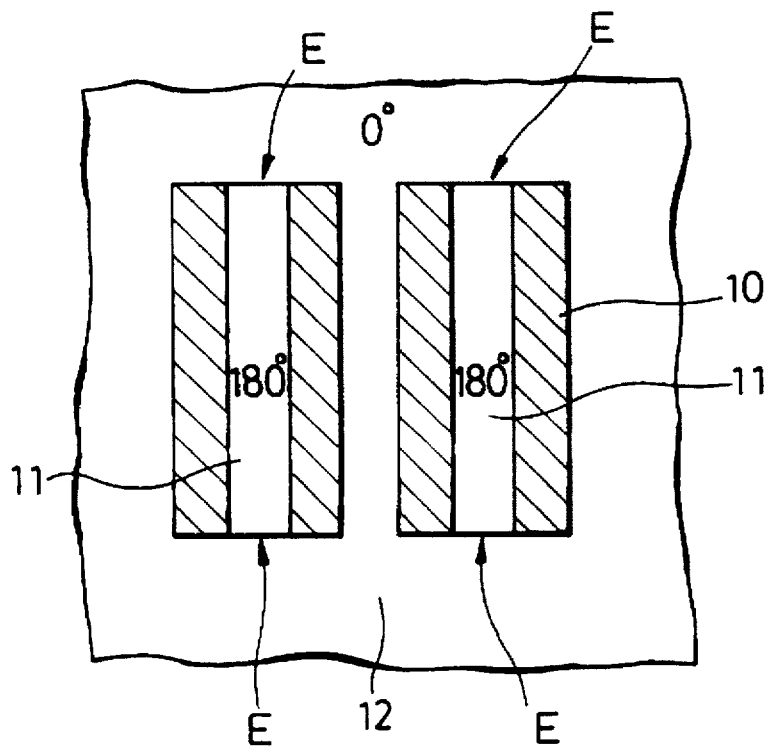
FIG. 6 is a view showing a problem in the prior art.
Figure 7:
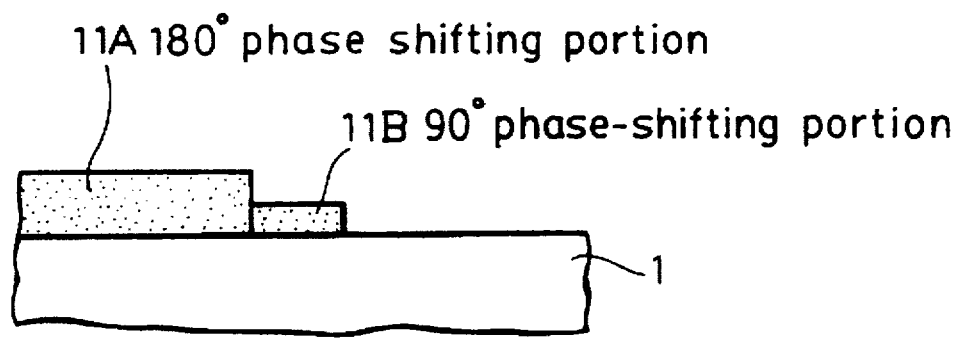
FIG. 7 is a view showing a problem in the prior art.

In this example, as shown in FIG. 4(a), a resist pattern 5 is previously formed on a light shielding portion 10 on a substrate 1 to which $SiO_2$ is sputtered as a phase-shifting material 61 to form a structure shown in FIG. 4(b). Subsequently, the phase-shifting material 61 on the resist pattern 5 is lifted off in the same manner as in the elimination of the resist pattern 5, to form a phase-shifting portion 11. In the case of this example, the phase-shifting material 6 is sputtered $SiO_2$ which forms, as it is, the phase-shifting portion 11. While the portion is slightly tapered (refer to FIG. 4(b) and (c)) different from the case of forming by etching, taper is permissible at the boundary of the phase-shifting amounts between 180° and 90° and between 90° and 0°.

Since the phase-shifting mask obtained in this example requires no etching stopper 7 as compared with the previous example, it has a merit that the transmittance is improved. This is advantageous, particularly, in a case of a light with short wavelength (KrF excimer laser: 248 nm).

The phase-shifting mask according to the present invention is applicable both to the negative type mask and the positive type mask and, accordingly, it has wide applicability. It can also provide advantageous effects capable of being formed easily and produced without causing problems, such as reduction of the transmittance or close contact.

Although various minor changes and modifications might be proposed by those skilled in the art, it will be understood that I with to include within the claims of the patent warranted hereon all such changes and modifications as reasonably come within my contribution to the art.

What is claimed is:

1. A phase-shifting mask, comprising:
   a phase shifting portion means for shifting a phase of a transmission light lying on both one surface and another surface of a transparent substrate, the two surfaces being at opposite sides of the substrate, and each of the phase shifting portion means projecting outwardly from each respective surface.

2. A phase-shifting mask according to claim 1 wherein at least a portion of the phase-shifting portion means on said one surface overlaps with at least a portion of the phase-shifting portion means on said another surface.

3. A phase-shifting mask, comprising:
   a light permeable portion having first and second opposite facing surfaces;
   lying on and projecting outwardly from said first surface a first phase-shifting portion being provided having an adjacent and associated light shielding portion positioned thereat;
   lying on and projecting outwardly from said second surface a second phase-shifting portion; and
   said second phase-shifting portion being dimensioned and aligned such that a first region thereof overlies and thus overlaps at least some of said first phase-shifting portion and a second region thereof does not overlie and thus does not overlap any part of said first phase-shifting portion.

4. A phase-shifting mask according to claim 3 wherein said first region of said second phase-shifting portion and an overlapping region of said first phase-shifting portion combine to form an increased phase shift for light passing therethrough compared to a phase shift which occurs at said second region of said second phase-shifting portion which does not overlie and overlap with any part of said first phase-shifting portion.

5. A phase-shifting mask according to claim 4 wherein at said first region approximately a 180° phase shift is provided for light passing through both regions and at said second region approximately a 90° phase shift occurs for light passing only through said second region of said second phase shifting portion.

6. A phase-shifting mask according to claim 3 wherein a plurality of said first phase-shifting portions are provided in side-by-side relationship on said first surface with each first phase-shifting portions having flanking light shielding portions and with a gap between adjacent light shielding portions of neighboring first phase-shifting portions, and wherein on said second surface a plurality of second phase-shifting portions are provided each having associated flanking light shielding portions and wherein a gap is provided between adjacent light shielding portions of adjacent second phase-shifting portions.

7. A phase-shifting mask according to claim 3 wherein said second phase-shifting portion has a longitudinal extent greater than a longitudinal extent of said first phase-shifting portion, said greater longitudinal extent providing said second region where said second phase-shifting portion does not overlap said first phase-shifting portion.

* * * * *